US012770248B2

(12) United States Patent
Kang et al.

(10) Patent No.: US 12,770,248 B2
(45) Date of Patent: Oct. 20, 2026

(54) OVERLAY MEASUREMENT APPARATUS AND OVERLAY MEASUREMENT METHOD

(71) Applicant: AUROS Technology, Inc., Hwaseong-si (KR)

(72) Inventors: Ji Hoon Kang, Osan-si (KR); Ji Yun Jung, Seoul (KR)

(73) Assignee: AUROS Technology, Inc., Hwaseong-si (KR)

( * ) Notice: Subject to any disclaimer, the term of this patent is extended or adjusted under 35 U.S.C. 154(b) by 264 days.

(21) Appl. No.: 18/593,565

(22) Filed: Mar. 1, 2024

(65) Prior Publication Data

US 2024/0296547 A1 Sep. 5, 2024

(30) Foreign Application Priority Data

Mar. 2, 2023 (KR) ........................ 10-2023-0027725

(51) Int. Cl.
*G06T 7/00* (2017.01)
*G01B 11/27* (2006.01)
(Continued)

(52) U.S. Cl.
CPC ............ *G06T 7/001* (2013.01); *G01B 11/272* (2013.01); *G01N 21/01* (2013.01);
(Continued)

(58) Field of Classification Search
CPC ....... G06T 7/001; G06T 7/0004; G06T 7/337; G06T 7/60; G06T 2207/10148; G06T 2207/30148; G01B 11/272; H04N 23/67; G01N 21/01; G01N 21/8806; G01N 21/956; G01N 21/95607; G01N 2021/95615
See application file for complete search history.

(56) References Cited

U.S. PATENT DOCUMENTS 7,218,399 B2 * 5/2007 Hayano ............... G03F 7/70633 356/401
9,104,120 B2 * 8/2015 Seligson ............. G03F 7/70633
(Continued)

FOREIGN PATENT DOCUMENTS

CN 108027568 A 5/2018
KR 1020060040402 5/2006
(Continued)

*Primary Examiner* — Jennifer Mehmood
*Assistant Examiner* — Jose M Torres
(74) *Attorney, Agent, or Firm* — WILLIAM PARK AND ASSOCIATES LTD.

(57) ABSTRACT

An overlay measurement apparatus includes: a light source unit configured to direct an illumination to an overlay measurement target in which a first filling unit formed in a first layer and a second filling unit formed in a second layer; a lens unit having an objective lens and a lens focus actuator; a detection unit acquiring a focus image at the measurement position; and a control unit aligning the sample image measured by the detection unit and a prestored setting model image, acquiring CI information of the aligned and sample image and setting model image, measuring a plurality of images by controlling the lens unit with a focus determined according to the CI information, and calculating an overlay with a difference value by comparing center points of the plurality of images.

10 Claims, 11 Drawing Sheets

(51) Int. Cl.

| | |
|---|---|
| ***G01N 21/01*** | (2006.01) |
| ***G01N 21/88*** | (2006.01) |
| ***G01N 21/956*** | (2006.01) |
| ***G06T 7/33*** | (2017.01) |
| ***G06T 7/60*** | (2017.01) |
| ***H04N 23/67*** | (2023.01) |
| ***H10P 74/00*** | (2026.01) |
| ***H10P 74/20*** | (2026.01) |

(52) U.S. Cl.

CPC ....... *G01N 21/8806* (2013.01); *G01N 21/956* (2013.01); *G01N 21/95607* (2013.01); *G06T 7/0004* (2013.01); *G06T 7/337* (2017.01); *G06T 7/60* (2013.01); *H04N 23/67* (2023.01); *H10P 74/203* (2026.01); *H10P 74/23* (2026.01); *G01N 2021/95615* (2013.01); *G06T 2207/10148* (2013.01); *G06T 2207/30148* (2013.01)

(56) References Cited

U.S. PATENT DOCUMENTS

| | | | | |
|---|---|---|---|---|
| 9,952,041 | B2 | 4/2018 | Roy et al. | |
| 10,101,676 | B2 | 10/2018 | Fu et al. | |
| 10,157,457 | B2 | 12/2018 | Xu et al. | |
| 10,684,562 | B2 * | 6/2020 | Shibazaki | G03F 7/70725 |
| 11,749,614 | B2 | 9/2023 | Kim et al. | |
| 11,835,865 | B2 * | 12/2023 | Shin | G03F 7/706845 |
| 12,085,383 | B2 * | 9/2024 | Park | G03F 9/7088 |
| 12,474,644 | B2 * | 11/2025 | Kim | G03F 7/70633 |
| 12,506,038 | B2 * | 12/2025 | Son | G01B 11/272 |
| 2005/0012928 | A1 * | 1/2005 | Sezginer | G01B 11/26 356/401 |
| 2005/0195398 | A1 * | 9/2005 | Adel | B82Y 10/00 356/401 |
| 2007/0133861 | A1 * | 6/2007 | Do | G03F 7/70633 382/149 |
| 2008/0013073 | A1 * | 1/2008 | Kobayashi | G03F 9/7011 356/73 |
| 2014/0375793 | A1 * | 12/2014 | Harada | G03F 7/70633 345/634 |
| 2015/0136976 | A1 * | 5/2015 | Matsuoka | G01N 23/2251 250/306 |
| 2016/0047744 | A1 * | 2/2016 | Adel | G03F 7/70633 356/243.1 |
| 2016/0313115 | A1 * | 10/2016 | Liu | G01B 11/272 |
| 2018/0293720 | A1 * | 10/2018 | Yoshitake | G06T 7/001 |
| 2022/0035258 | A1 * | 2/2022 | Lee | G02B 27/0955 |
| 2022/0326008 | A1 * | 10/2022 | Park | G03F 7/70633 |

FOREIGN PATENT DOCUMENTS

| | | | |
|---|---|---|---|
| KR | 20070015310 | A | 2/2007 |
| KR | 101714616 | B1 | 4/2017 |
| KR | 1020190029764 | A | 3/2019 |
| KR | 102337617 | B1 | 12/2021 |
| KR | 1020220060915 | A | 5/2022 |

* cited by examiner

OVERLAY MEASUREMENT APPARATUS AND OVERLAY MEASUREMENT METHOD

CROSS-REFERENCE TO RELATED APPLICATIONS

This application claims priority under 35 U.S.C 119(a) to Korean Patent Application No. 10-2023-0027725 filed in the Korean Intellectual Property Office on Mar. 2, 2023, the entire contents of which are incorporated herein by reference.

TECHNICAL FIELD

The present invention relates to overlay measurement of a wafer, and particularly, to an overlay measurement apparatus and an overlay measurement method.

BACKGROUND ART

In general, with the development of technology, a size of a semiconductor device is becoming smaller, and the density of an integrated circuit on a wafer is increasing. In order to form the integrated circuit on the wafer, a lot of manufacturing processes should be performed so that a desired circuit structure and desired circuit elements are sequentially formed at specific locations. In such a manufacturing process, patterned layers are sequentially generated on the wafer.

Through the repeated lamination processes, electrically activated patterns are generated in the integrated circuit. In this case, if respective structures are not aligned within an error range permitted in a production process, an inference occurs between the electrically activated patterns, and there may be a problem in performance and reliability of the manufactured circuit due to such a phenomenon.

Accordingly, in order to measure and verify an alignment error between layers, an alignment degree between a pattern of an upper layer and a pattern of a lower layer is detected by using an overlay measurement pattern on the wafer, and a lot of semiconductor elements including through silicon via (TSV) are used in a recent semiconductor package, so the TSV can be used upon alignment measurement between layers in the semiconductor element.

The TSV is formed by filling a conductor such as copper, etc., by forming a hole penetrating a silicon substrate, and may be used for transferring inter-chip signals and power by electrically connecting upper and lower portions of the silicon substrate upon chip stacking. However, when the TSV in the wafer is measured, there is a problem in that all images in each layer are not clear.

SUMMARY OF THE INVENTION

The present invention is contrived to solve various problems including the above problem, and misalignment and connection of TSV may be identified, and an overlay of a layer stacked on a wafer may be measured through TSV measurement. Further, the present invention has been made in an effort to provide an overlay measurement apparatus and the overlay measurement method which may determine and measure an optical focus even when a shape of the TSV is unusual. However, such an object is exemplary and the scope of the present invention is not limited thereto.

An exemplary embodiment of the present invention provides an overlay measurement apparatus. The overlay measurement apparatus may include: a light source unit configured to direct an illumination to an overlay measurement target in which a first filling unit formed in a first layer and a second filling unit formed in a second layer stacked on an upper portion or a lower portion of the first layer are positioned; a lens unit having an objective lens condensing the illumination on a measurement position of any one point in the overlay measurement target and a lens focus actuator controlling a distance between the objective lens and the overlay measurement target; a detection unit acquiring a focus image at the measurement position through a beam reflected on the measurement position; and a control unit aligning the sample image measured by the detection unit and a prestored setting model image, acquiring CI information of the aligned and sample image and setting model image, measuring a plurality of images by controlling the lens unit with a focus determined according to the CI information, and calculating an overlay with a difference value by comparing center points of the plurality of images.

According to an exemplary embodiment of the present invention, the control unit may control to select the setting model image through information on a wafer in which the first layer and the second layer are formed, align the setting model image and the sample image so that center points of the setting model image and the sample image are the same as each other, and acquire an X-axis brightness value graph and a Y-axis brightness value graph, and calculate a first focus in an area having a lowest CI value in the X-axis brightness value graph and the Y-axis brightness value graph, and measure a first image which is one of the plurality of images with the first focus, and control to calculate a second focus in an area having a highest CI value in the X-axis brightness value graph and the Y-axis brightness value graph, and measure a second image which is the other one of the plurality of images with the second focus.

According to an exemplary embodiment of the present invention, the control unit may include a storage unit storing the sample image acquired by the detection unit, model information of a layer stacked in the wafer, and the plurality of images measured with the focus determined according to the CI information, an alignment unit aligning the setting model image of any one the model information and the sample image by comparing center points of the setting model image and the sample image, a CI acquisition unit acquiring the CI information indicating the X-axis brightness value change and the Y-axis brightness value change of the setting model image and the sample image of which center points coincide with each other, a focus calculation unit calculating the first focus at a point having a lowest CI value among the CI information, and calculating the second focus at a point having a highest CI value among the CI information, and an overlay calculation unit comparing center points of the plurality of images, and calculating a difference.

According to an exemplary embodiment of the present invention, the setting model image may be formed in any one of a quadrangle, a quadrangle having corners with a predetermined curvature, a circle, and an ellipse according to prestored thicknesses of the first layer and the second layer, or the sample image.

According to an exemplary embodiment of the present invention, the control unit may include a lens operation unit controlling an operation of the lens focus actuator to acquire respective images of the first layer and the second layer by depth according to the focus.

According to an exemplary embodiment of the present invention, the first filling unit and the second filling unit may be through silicon vias (TSVs) which are filled in a hole portion penetrating the first layer and the second layer as a conductor to electrically connect patterns formed in the first layer and the second layer.

Another exemplary embodiment of the present invention provides an overlay measurement method. The overlay measurement method may include: a setting model comprising step of aligning a sample image measured at a measurement position of any one point among overlay measurement targets at which a first filling unit formed in a first layer and a second filling unit formed in a second layer, which is stacked at an upper portion or a lower portion of the first layer are positioned, and a prestored setting model image; a CI information acquiring step of acquiring CI information of the aligned sample image and the setting model image; an image measuring step measuring a plurality of images by controlling the lens unit with a focus determined according to the CI information; and an overlay calculating step of comparing center points of the plurality of images, and calculating an overlay with a difference value.

According to an exemplary embodiment of the present invention, the setting model comparing step may include a sample image measuring step of measuring and storing the sample image by a detection unit, a model selecting step of selecting the setting model image through information on a wafer in which the first layer and the second layer are formed, and a comparison step of aligning the setting model image and the sample image so that center points of the setting model image and the sample image are the same as each other.

According to an exemplary embodiment of the present invention, in the CI information acquiring step, the CI information indicating the X-axis brightness value change and the Y-axis brightness value change of the aligned setting model image and the sample image of which center points coincide with each other may be acquired.

According to an exemplary embodiment of the present invention, the image measuring step may include a focus calculating step of calculating the first focus at a point having a lowest CI value among the CI information, and calculating the second focus at a point having a highest CI value among the CI information, and a measurement step of measuring a first image with the first focus determined according to the CI information, and measuring a second image with the second focus.

According to some exemplary embodiments of the present invention achieved as above, a focus for measuring an overlay in a wafer including two or more layers is calculated, and an overlay of TSV is measured according to the calculated focus to identify misalignment and connection of the TSV, and calculate an overlay value of layers stacked on the wafer through TSV measurement. Further, there is an effect in that the overlay value can be calculated by determining the optimal focus through an overlay measurement apparatus of the present invention even when a shape of the TSV is unusual. Of course, the scope of the present invention is not limited by such an effect.

DETAILED DESCRIPTION

Figure 1:
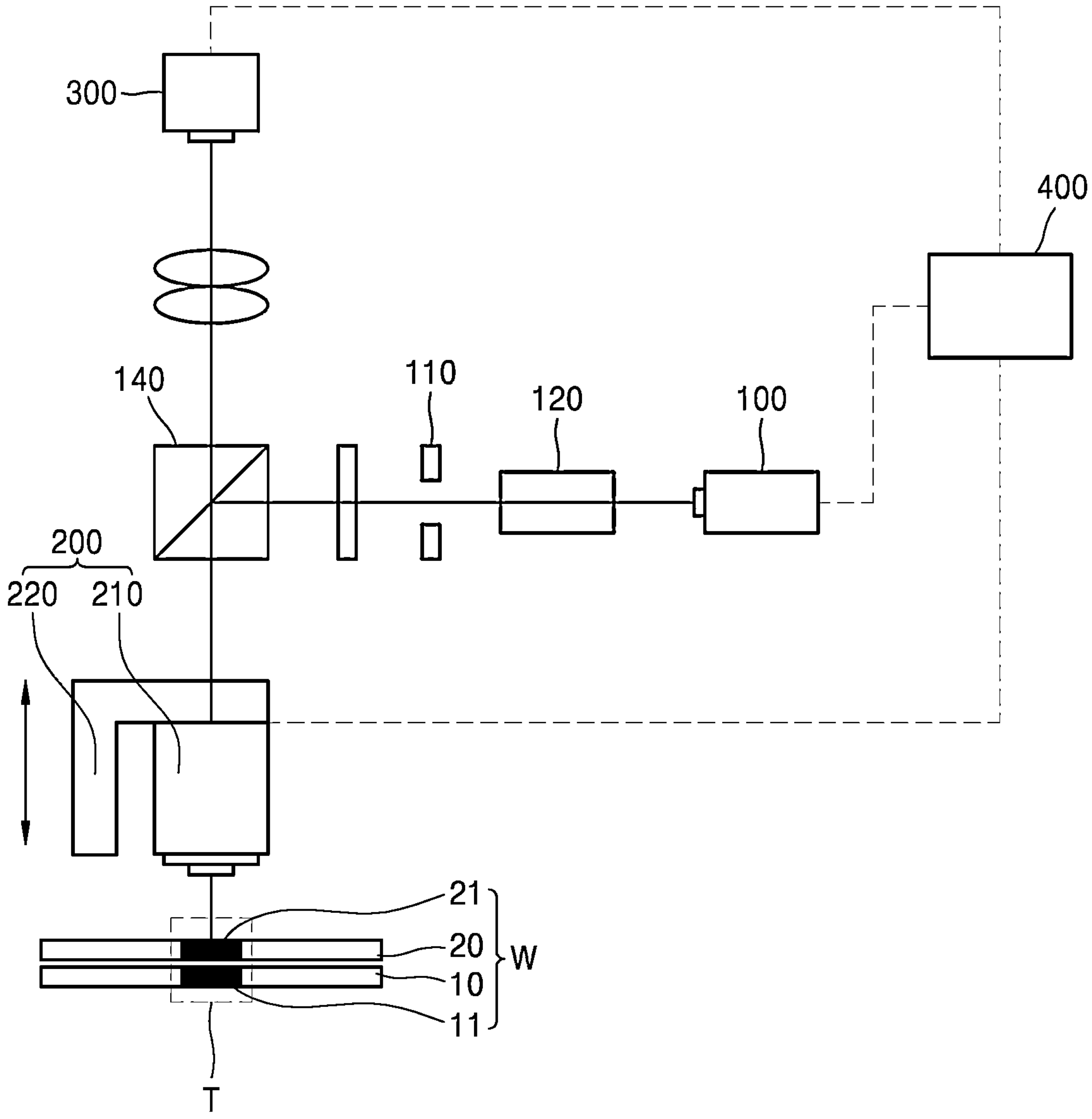
FIG. 1 is a diagram schematically illustrating an overlay measurement apparatus according to an exemplary embodiment of the present invention.

Hereinafter, various preferred embodiment of the present invention will be described in detail with reference to the accompanying drawings.

The exemplary embodiments of the present invention are provided to explain the present invention more completely to those skilled in the art, and the following embodiments may be transformed into several different forms, and the scope of the present invention is not limited to the following embodiments. On the contrary, the exemplary embodiments are provided to be further and complete, and to fully convey the ideas of the present invention to those skilled in the art. In addition, the thickness and size of each layer in the drawing is exaggerated for the convenience and clarity of the description.

Hereinafter, the exemplary embodiments of the present invention will be described with reference to the drawings schematically illustrating the ideal embodiments of the present invention. In the drawings, for example, according to the manufacturing technology and/or tolerance, the deformation of the shown shape may be expected. Accordingly, an exemplary embodiment of the present invention is not interpreted as limited to a specific shape of the area shown herein, and should include, for example, a change in the shape caused by the manufacture.

Figure 2:
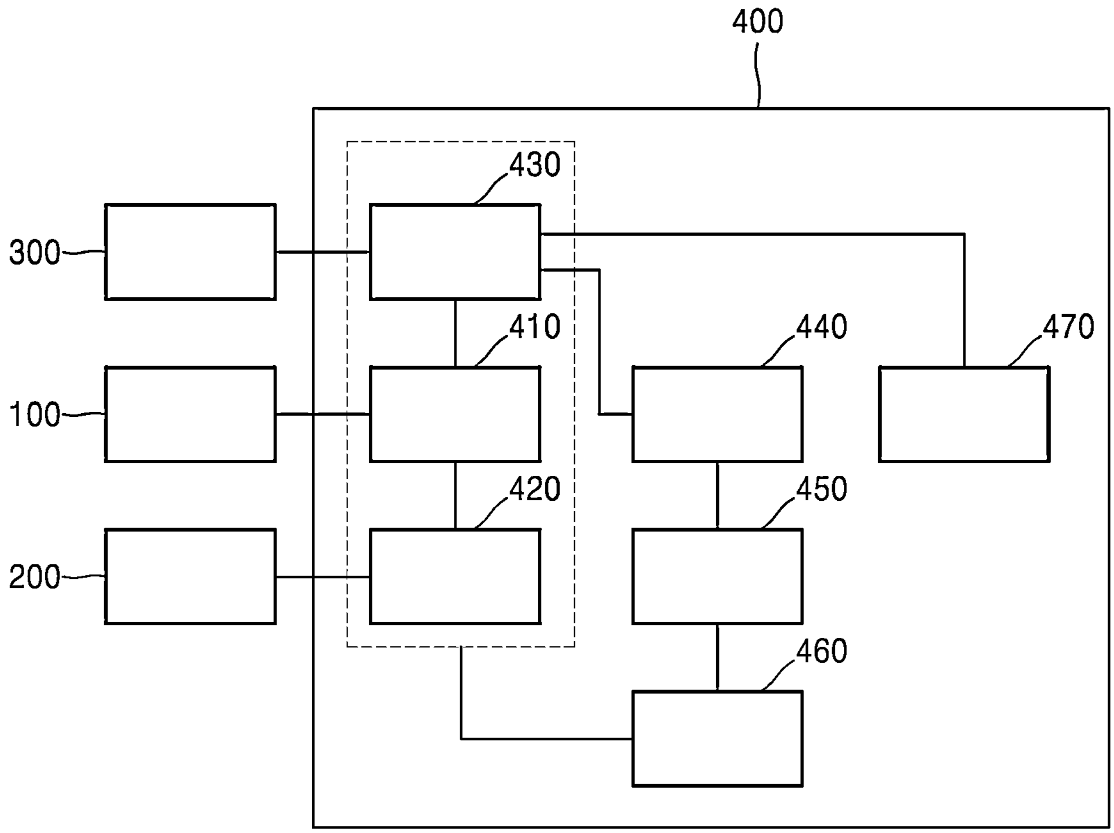
FIG. 2 is a diagram illustrating a control unit of the overlay measurement apparatus according to the present invention.
Figure 6:
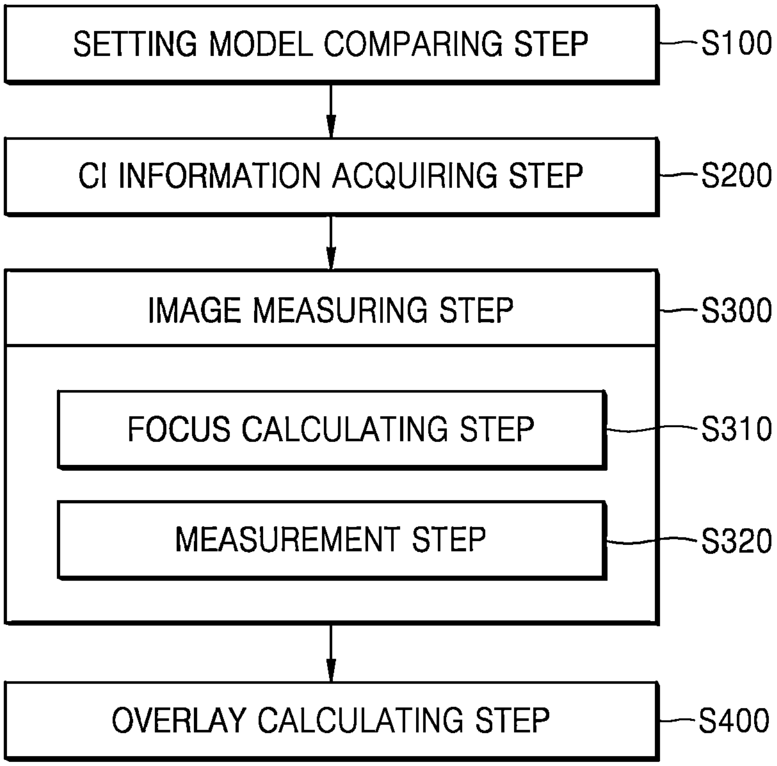

FIG. 1 is a diagram schematically illustrating an overlay measurement apparatus according to an exemplary embodiment of the present invention, FIG. 2 is a diagram illustrating a control unit 400 of the overlay measurement apparatus of the present invention, and FIG. 6 is an exemplary diagram illustrating that CI information is acquired by aligning a sample image S and a setting model image M according to an exemplary embodiment of the present invention.

First, according to an exemplary embodiment of the present invention, the overlay measurement apparatus may generally include a light source unit 100, a lens unit 200, a detection unit 300, and a control unit 400.

As illustrated in FIG. 1, an illumination may be directed from at least one illumination source to an overlay measurement target T. Specifically, the light source unit 100 may be configured to direct the illumination to the overlay measurement target T at which a first filling unit 11 formed in a first layer 10 and a second filling unit 21 formed in a second layer 20 stacked above or below the first layer 10 are positioned.

For example, the light source unit 100 may be formed as a halogen lamp, a xenon lamp, a supercontinuum laser, a light emitting diode, a laser inducted lamp, etc., and may include various wavelengths such as ultraviolet (UV), visible ray, or infrared rays (IR), etc., and is not limited thereto.

According to an exemplary embodiment of the present invention, the overlay measurement apparatus may include a stop 110, a spectrum filter 120, a polarization filter 130, and a beam splitter 140.

The stop 110 may be formed as an opaque plate with an opening through which light passes, and a beam irradiated by the light source unit 100 may be changed to a form suitable for photographing the first filling unit 11 and the second filling unit 21.

The stop 110 may include at least one of an aperture stop for controlling the amount of light and a field stop for controlling a focusing scope of an image, and may be formed between the light source unit 100 and the beam splitter 140 as illustrated in FIG. 1, and formed between the beam splitter 140 and the lens unit 200 although not illustrated.

The spectrum filter 120 may control a center wavelength and a bandwidth of the beam irradiated by the light source unit 100 to be suitable for acquiring the images of the first layer 10 and the second layer 20 formed in the overlay measurement target T. For example, the spectrum filter 120 may be formed as at least one of a filter wheel, a linear translation device, a flipper device, and a combination thereof.

The beam splitter 140 transmits a part of the beam output from the light source unit 100, and then passing through the stop 110, and reflects a part and separates the beam output from the light source unit 100 into two beams.

As illustrated in FIG. 1, the lens unit 200 may have an objective lens 210 that concentrates the illumination at a measurement position of any one point in the overlay measurement target T and a lens focus actuator 220 that controls a distance between the objective lens 210 and the overlay measurement target T.

The objective lens 210 may condense the beam reflected on the beam splitter 140 on measurement positions in which the first layer 10 and the second layer 20 are formed in the wafer W, and collect the reflected beam.

The objective lens 210 may be installed in the lens focus actuator 220.

The lens focus actuator 220 controls a distance between the objective lens 210 and the wafer W to control a focal surface to be positioned in the first layer 10 or the second layer 20.

The lens focus actuator 220 may control a focal distance by vertically moving the objective lens 210 toward the wafer W by the control of the control unit 400.

In this case, the measurement position as at least any one point of the overlay measurement target T may be a position at which the first filling unit 11 and the second filling unit 21 formed in the first layer 10 or the second layer 20 is formed.

Here, the first filling unit 11 and the second filling unit 21 as structures in which a conductor such as copper is filled in a hole penetrating the first layer 10 and the second layer 20 may include TSV transferring inter-chip signals and power by electrically connecting the first layer 10 and the second layer 20 when the first layer 10 and the second layer 20 are stacked.

For example, the first filling unit 11 may be formed in the first layer 10 which is a lower layer of the wafer W, and the second filling unit 21 may be formed in the second layer 20 which is an upper layer of the wafer W. At this time, in the image measured by the lens unit 200 formed above the wafer W, the first filling unit 11 may be measured to be smaller than the second filling unit 21.

Further, although not illustrated, the TSV may be a truncated reverse cone shape, and may be formed with different sizes, and formed to have an irregular shape.

The measurement position may include all depths for each step measured respective positions according to driving of the lens focus actuator 220.

As illustrated in FIG. 1, the detection unit 300 may acquire a focus image at the measurement position through the beam reflected at the measurement position.

The detection unit 300 captures a beam output by passing the beam reflected on the overlay measurement target T through the beam splitter 140 to acquire the images of the first layer 10 and the second layer 20.

The detection unit 300 may include an optical detector which may measure the beam reflected on the overlay measurement target T, and the optical detector may include, for example, a charge-coupled device (CCD) converting light into a charge to extract the image, a complementary metal-oxide-semiconductor (CMOS) sensor which is one integrated circuit, a photomultiplier tube (PMT) measuring the light, an avalanche photodiode (APD) array as an optical detection device, or various sensors generating or capturing the image.

The detection unit 300 may include a filter, a polarizer, and a beam block, and further include an arbitrary collection optical component (not illustrated) for collecting the illumination collected by the objective lens 210.

As illustrated in FIG. 1, the control unit 400 may control directing of the illumination irradiated by the light source unit 100, and control the lens unit 200 to concentrate the illumination at the overlay measurement target T and collect the reflected beam, and control the detection unit 300 to acquire the focus image measured through the reflected beam collected by the lens unit 200.

The control unit 400 may include an auto recipe optimization (ARO) program that automatically optimizes an overlay measurement recipe through filter optimization information, stop optimization information, focus optimization information, and pin-hole optimization information.

The control unit 400 may acquire the CI information by aligning the sample image S measured by the detection unit 300 and a prestored setting model image M, measure a plurality of images by controlling the lens unit 200 with a focus determined according to the CI information of the aligned and overlapped sample image S and setting model image M, and calculate an overlay with a difference value by comparing center points of the plurality of images.

Specifically, the control unit 400 may include a light source operation unit 410, a lens operation unit 420, a storage unit 430, an alignment unit 440, a CI acquisition unit 450, a focus calculation unit 460, and an overlay calculation unit 470.

As illustrated in FIG. 2, the light source operation unit 410 may control directing of the illumination irradiated by the light source unit 100, and the lens operation unit 420 may control an operation of the lens focus actuator 220 to condense the illumination in the overlay measurement target T and acquire the respective images of the first layer 10 and the second layer 20 by depth according to the focus.

The storage unit 430 may store the sample image S acquired by the detection unit 300, model information of layers stacked on the wafer W, and the plurality of images measured with the focus determined according to the CI information.

Specifically, the storage unit 430 may store, in the storage unit 430, the image measured by the detection unit 300 as the sample image S. At this time, the sample image S may be measured by controlling a focus with a temporary focus through wafer (W) information including thicknesses of the first layer 10 and the second layer 20 prestored.

The storage unit 430 may include a plurality of model information. In this case, the model information may include a setting model image M formed in a quadrangle, a quadrangle having corners with a predetermined curvature, a circle, and an ellipse. For example, the setting model image M may include an image according to a virtual focus which is matched with any one of the first layer 10 and the second layer 20 through prestored wafer (W) information. Further, an image corresponding to a shape of the sample image S among the model information of various shapes, e.g., an image resembled with the sample image S may be selected as the setting model image M.

Further, with respect to the setting model image M, the user may directly set a circular size and a curvature of a quadrangular corner.

For example, the sample image S may be an image corresponding to the second layer 20 with a temporary focus, and the setting model image M may be an image corresponding to the first layer 10 set according to prestored wafer (W) information.

The storage unit 430 may store a first image I1 and a second image I2 detected through a first focus and a second focus to be described below in order to measure the overlays of the first layer 10 and the second layer 20.

The alignment unit 440 may compare and align the center points of any one setting model image M and the sample image S among the model information.

For example, as illustrated in FIGS. 3A and 3B, the alignment unit 440 may be aligned so that the setting model image M becomes a coaxial axis to the central axis of the sample image S, and although not illustrated, the setting model image M may be formed outside the sample image S, and in the case of an elliptical shape, may be aligned so that long axes are the same, or an irregular shape is converted into a circular shape or the elliptical shape, and the setting model image M and the sample image S may be aligned so that the coaxial axes or the long axes are the same.

The CI acquisition unit 450 may acquire CI information indicating an X-axis brightness value change and a Y-axis brightness value change of the setting model image M and the sample image S of which center points coincide with each other.

The CI information is data including brightness values of the setting model image M and the sample image S, and for example, as illustrated in FIG. 3A, a change of a brightness value in an X axis-direction cross section based on center portions or horizontal center areas of the setting model image M and the sample image S may be represented by a graph, and as illustrated in FIG. 3B, a change of the brightness value in a Y axis-direction cross section based on the center portions or vertical center areas of the setting model image M and the sample image S may be represented by a CI graph.

Figure 3:
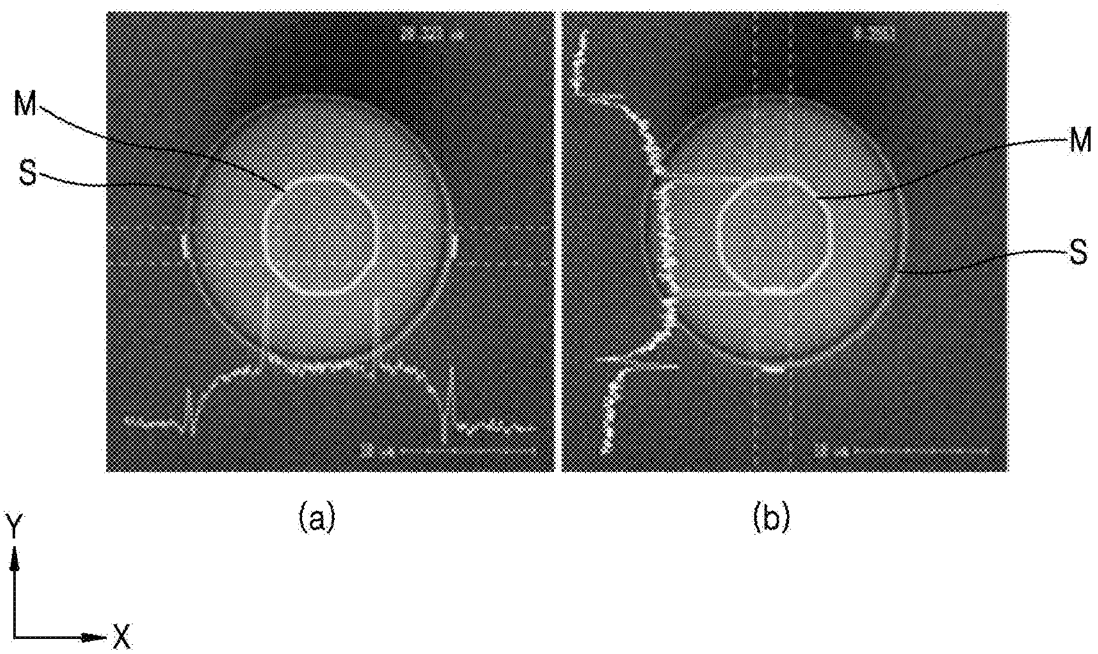
FIG. 3 is an exemplary diagram illustrating that CI information is acquired by aligning a sample image and a setting model image according to an exemplary embodiment of the present invention.

In this case, the CI as the contrast index may mean an overall contrast degree of an image pixel value, and may be a value representing a difference between a color and brightness of the image. For example, as illustrated in FIG. 3(*a*), the brightness of a line of the setting model image M is set to be very bright, and a brightness value is represented to be highest in a part corresponding to the line of the setting model image M in the CI graph, and a brightness of an outer line of the sample image S is detected to be bright, and lower than the brightness of the setting model image M, but represented to be higher than the brightness of a peripheral portion, and an inner line of the sample image S is detected to be very dark and the brightness value is represented to be lowest.

The focus calculation unit 460 may calculate the first focus at a point having a lowest CI value among the CI information, and calculate the second focus at a point having a highest CI value among the CI information.

For example, the focus calculation unit 460 may calculate the first focus to focus on a shape having a lowest value of the brightness value as a diameter in the CI graph, and calculate the second focus to focus on a shape having a highest value of the brightness value as the diameter in the CI graph. At this time, the highest value of the brightness value in the CI graph may be CI information of the setting model image M, and further, the sample image S is not focused, so the thickness and the brightness are not certain, and as a result, the second focus may be calculated at the lowest value in terms of the brightness value.

Therefore, in the lens operation unit 420, the first image I1 may be measured with the first focus, and the second image I2 may be measured with the second focus. As the images are measured with the first focus and the second focus, the first image I1 and the second image I2 which are more accurate, i.e., the images of the first filling unit 11 and the second filling unit 21 may be acquired.

The overlay calculation unit 470 may calculate a difference by comparing the center points of the plurality of images. For example, the overlay calculation unit 470 may calculate a gap between a center portion C1 of the first image I1 and a center portion C2 of the second image I2 by overlapping the first image I1 and the second image I2, and measure the gap with the overlay value.

Specifically, the overlay calculation unit 470 may acquire a graph of CI values of an X axis and a Y axis in the first image I1, and calculate the center portion C1 of the first image I1 by using center values of two positions having a largest CI value, and similarly, calculate the center portion C2 of the second image I2. Accordingly, the difference between the center portion C1 of the first image I1 and the center portion C2 of the second image I2 may be measured as the overlay value.

Further, a series of processes performed by the control unit 400 may include a display unit (not illustrated) so as to be monitored by the user, and may include an input unit (not illustrated) which may be directly controlled by the user.

That is, the storage unit 430, the alignment unit 440, the CI acquisition unit 450, the focus calculation unit 460, the overly calculation unit 470, the setting model image M, the sample image S, and the CI graph may be identified through the display unit, and the user may directly control the light source operation unit 410 and the lens operation unit 420 through the input unit, or directly select, change, and calculate the setting model image M, the sample image S, the CI graph, the first focus, the second focus, etc.

Besides, the overlay measurement apparatus may include a memory storing instructions, programs, logic, etc., for controlling operations of respective components of the overlay measurement apparatus by the control unit 400, and the components may be added, changed, or deleted as necessary.

That is, the overlay measurement apparatus according to the present invention may calculate the focus for measuring the overlay in the wafer including two or more layers, and measures the overlay of the TSV according to the calculated focus to identify the connection of the TSV, and accurately determine an overlay of the first layer and the second layer.

Figure 4:
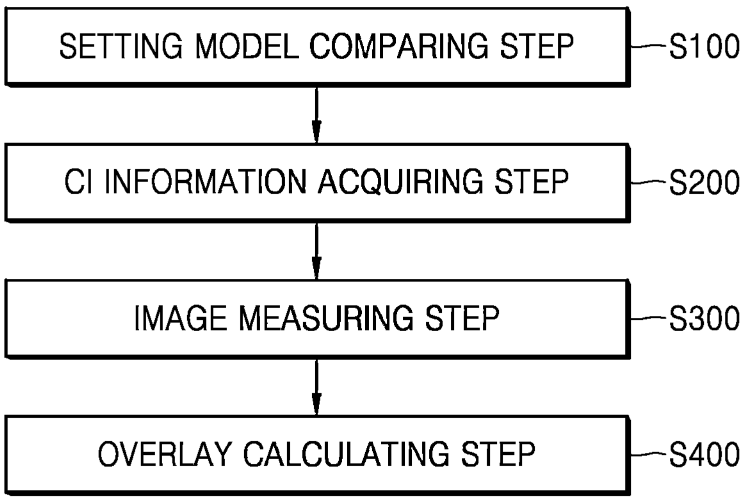
FIGS. 4 to 6 are diagrams illustrating an overlay measurement method according to an exemplary embodiment of the present invention.
Figure 5:
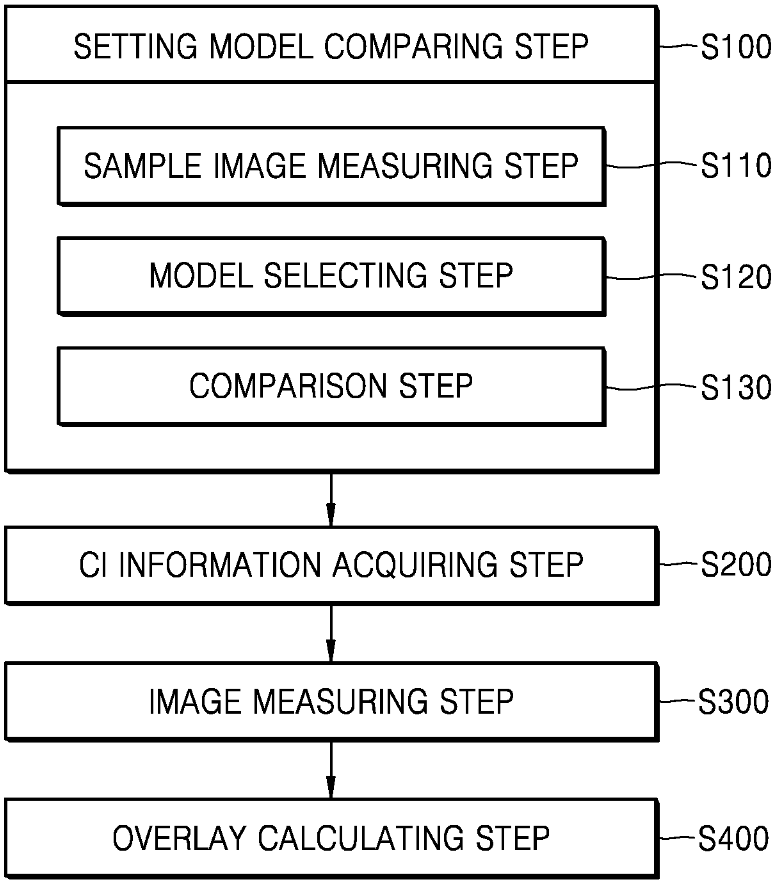
Figure 7:
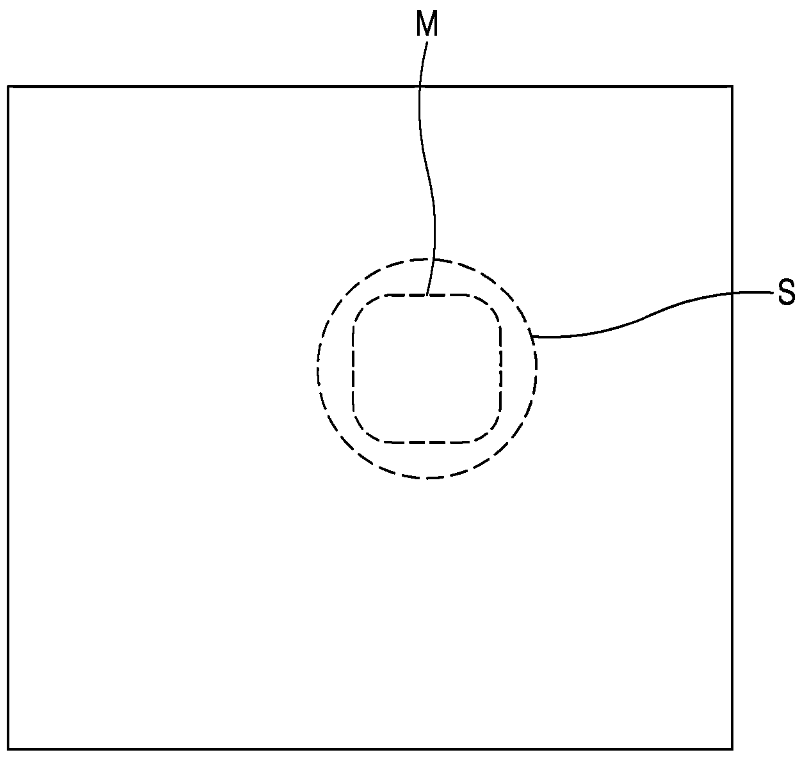
FIG. 7 is a diagram illustrating a setting model comparison step of the overlay measurement method according to an exemplary embodiment of the present invention.
Figure 8:
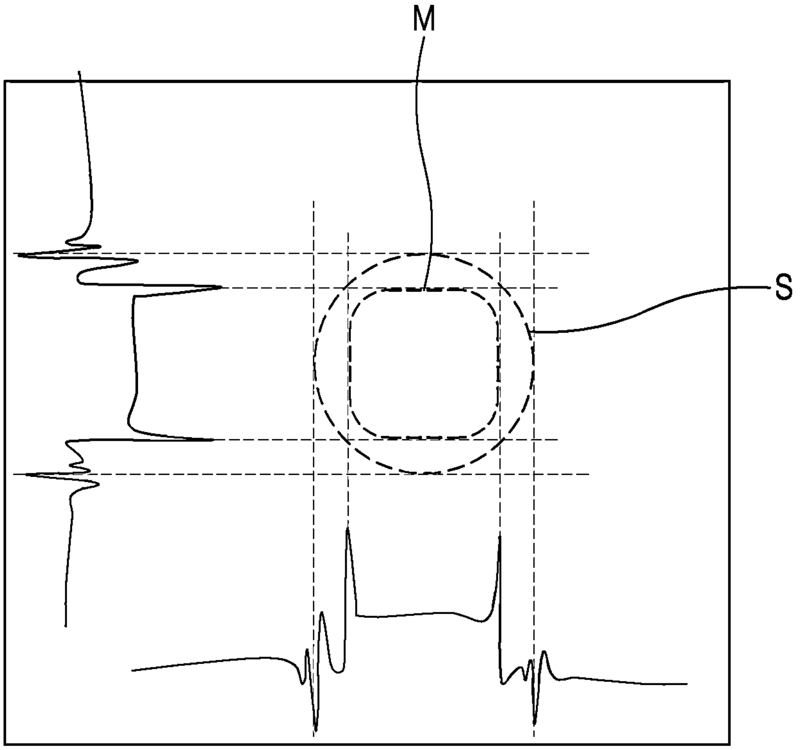
FIG. 8 is a diagram illustrating a CI information acquiring step of the overlay measurement method according to an exemplary embodiment of the present invention.
Figure 9:
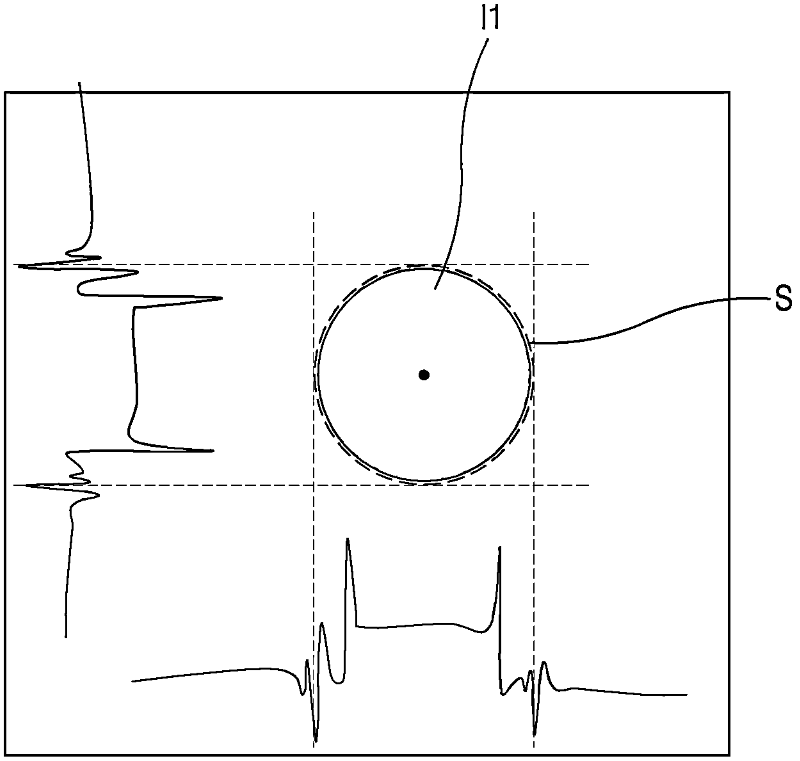
FIG. 9 is a diagram illustrating a first image is measured in an image measuring step of the overlay measurement method according to an exemplary embodiment of the present invention.
Figure 10:
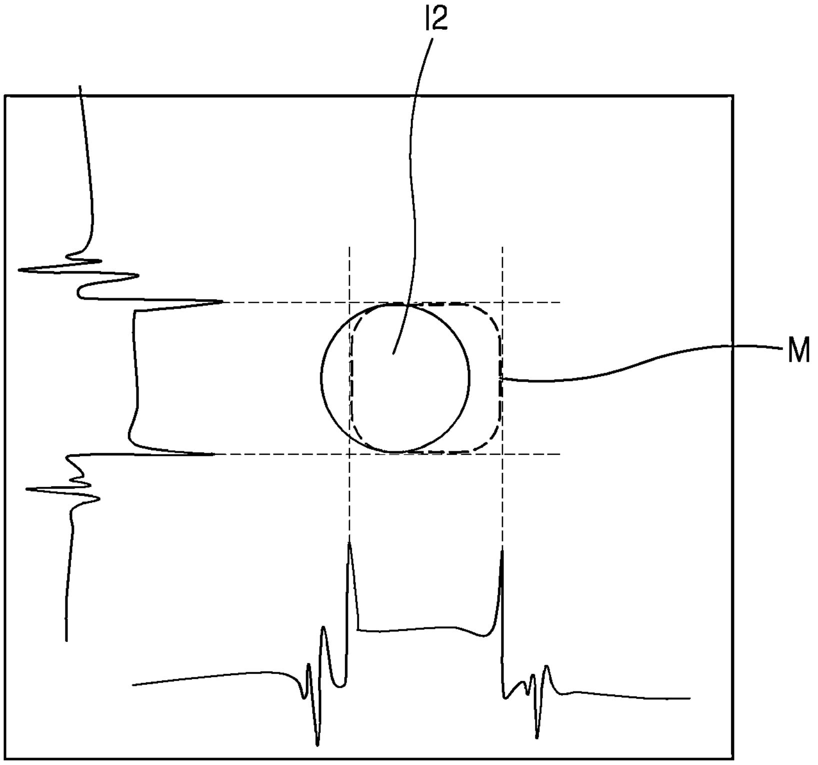
FIG. 10 is a diagram illustrating that a second image is measured in the image measuring step of the overlay measurement method according to an exemplary embodiment of the present invention.
Figure 11:
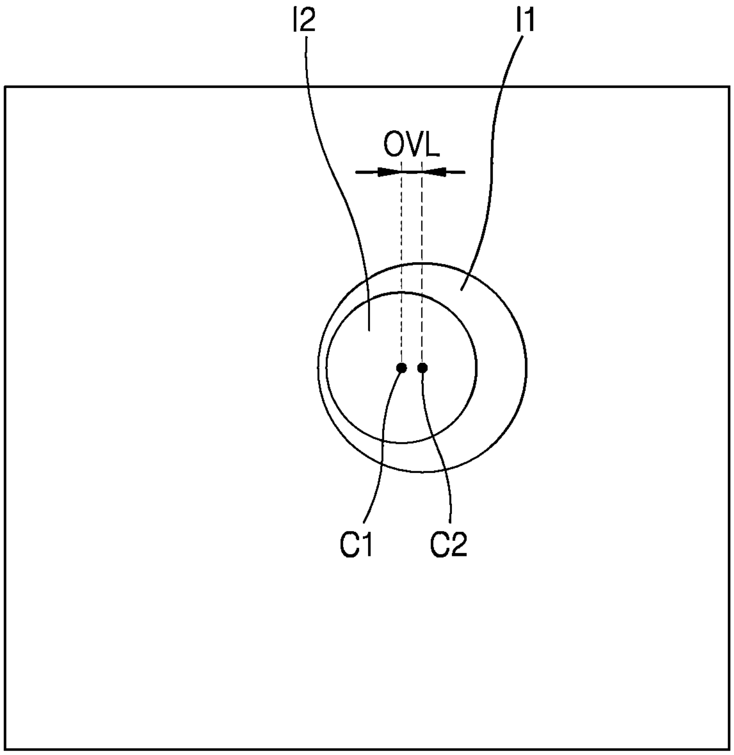
FIG. 11 is a diagram illustrating an overlay calculating step of the overlay measurement method according to an exemplary embodiment of the present invention.

FIGS. 4 to 6 are diagrams illustrating an overlay measurement method according to an exemplary embodiment of the present invention, FIG. 7 is a diagram illustrating a setting model comparison step S100 of the overlay measurement method according to an exemplary embodiment of the present invention, FIG. 8 is a diagram illustrating a CI information acquiring step S200 of the overlay measurement method according to an exemplary embodiment of the present invention, FIGS. 9 and 10 are diagrams illustrating that a first image I1 and a second image I2 are measured in an image measuring step S300 of the overlay measurement method according to an exemplary embodiment of the present invention, and FIG. 11 is a diagram illustrating an overlay calculating step S400 of the overlay measurement method according to an exemplary embodiment of the present invention.

As illustrated in FIG. 4, according to an exemplary embodiment of the present invention, the overlay measurement method may include a setting model comparing step S100, a CI information acquiring step S200, an image measuring step S300, and an overlay calculating step S400.

The setting model comprising step S100 is a step of aligning a sample image S measured at a measurement position of any one point among overlay measurement targets T at which a first filling unit 11 formed in a first layer 10 and a second filling unit 21 formed in a second layer 20, which is stacked above or below the first layer 10 are positioned, and a prestored setting model image M.

For example, as illustrated in FIG. 7, the setting model comparing step S100 is a step of aligning a sample image S measured by controlling a focus with a temporary focus through wafer (W) information including thicknesses of the first layer 10 and the second layer 20 prestored, and a setting model image M which is an image according to a virtual focus which is matched with any one of the first layer 10 and the second layer 20 through the wafer (W) information.

Specifically, the setting model comparing step S100 may include a sample image measuring step S110 of measuring and storing, by a detection unit 300, the sample image S, a model selecting step S120 of selecting the setting model image M through information on a wafer W in which the first layer 10 and the second layer 20 are formed, and a comparison step S130 of aligning the setting model image M and the sample image S so that center points of the setting model image M and the sample image S are the same as each other.

The CI information acquiring step S200 is a step of acquiring CI information indicating an X-axis brightness value change and a Y-axis brightness value change of the aligned setting model image M and sample image S of which center points coincide with each other.

In the CI information acquiring step S200, the CI information is data including the brightness values of the setting model image M and the sample image S, and for example, as illustrated in FIG. 8, in the CI information acquiring step S200, a change of the brightness value in X- and Y-axis cross sections may be represented by the CI graph based on centers of the setting model image M and the sample image S.

The image measuring step S300 is a step of measuring a plurality of images by controlling a lens unit 200 with a focus determined according to the CI information.

The image measuring step S300 may include a focus calculating step S310 and a measurement step S320.

The focus calculating step S310 is a step of calculating a first focus at a point having a lowest CI value among the CI information, and calculating a second focus at a point having a highest CI value among the CI information, and the measurement step S320 is a step of measuring a first image I1 with the first focus determined according to the CI information, and measuring a second image I2 with the second focus.

For example, as illustrated in FIG. 9, in the focus calculating step S310, the first focus may be calculated to focus on a shape having a lowest value of the brightness value in the CI graph as a diameter, and in the measurement step S320, the first image I1 may be measured with the first focus. Accordingly, the image is measured by re-adjustment with the first focus to acquire a first image I1 which is more accurate than the sample image S, i.e., an image of the first filling unit 11.

Further, as illustrated in FIG. 10, in the focus calculating step S310, the second focus may be calculated to focus on a shape having a highest value of the brightness value in the CI graph as the diameter, and in the measurement step S320, the second image I2 may be measured with the second focus. At this time, the second image I2 which measures the second filling unit 21 of the second layer 20 may be formed at a different position from the setting model image M. That is, the setting model image M which is to calculate the second focus may be different from the second image I2 measured with the second focus.

The measurement step S320 may further include an illumination directing step S110 of directing an illumination to an overlay measurement target T at which the first layer 10 and the second layer 20 are positioned from the light source unit 100, and a target irradiation step of controlling a lens focus actuator 220 controlling a distance between an objective lens 210 and the overlay measurement target T to condense the illumination on a measurement position of any one point in the overlay measurement target T through the lens unit 200.

The overlay calculating step S400 is a step of calculating an overlay with a difference value by comparing the center points of the plurality of images. For example, as illustrated in FIG. 11, in the overlay calculating step S400, a gap between a center portion C1 of the first image I1 and a center portion C2 of the second image I2 is calculated by comparing the first image I1 and the second image I2 to be measured with an overlay OVL.

That is, the overlay measurement method according to the present invention may calculate the focus for measuring the overlay in the wafer including two or more layers, and measures the overlay of the TSV according to the calculated focus to identify the misalignment and connection of the TSV, and calculate an overlay value of the first layer and the second layer through TSV measurement.

In particular, even when a shape of the TSV is unusual, the overlay value through the TSV may be calculated through the overlay measurement apparatus and method of the present invention by setting various shapes and curvatures.

The present invention has been described with reference to the exemplary embodiment illustrated in the drawings, but this is just exemplary and it will be appreciated by those skilled in the art that various modifications and other embodiments equivalent thereto can be made therefrom. Accordingly, the true technical scope of the present invention should be defined by the technical spirit of the appended claims.

What is claimed is:

1. An overlay measurement apparatus comprising:

a light source configured to direct an illumination to an overlay measurement target in which a first filling unit formed in a first layer and a second filling unit formed in a second layer stacked on an upper portion or a lower portion of the first layer are positioned;

a lens having an objective lens condensing the illumination on a measurement position of any one point in the overlay measurement target and a lens focus actuator controlling a distance between the objective lens and the overlay measurement target;

a detector configured to acquire a sample image at the measurement position through a beam reflected on the measurement position; and a controller configured to align the sample image measured by the detector and a prestored setting model image, acquire CI information of the aligned sample image and the setting model image, measure a plurality of images by controlling the lens with a focus determined according to the CI information, and calculate an overlay with a difference value by comparing center points of the plurality of images.

2. The overlay measurement apparatus of claim 1, wherein the controller is configured to select the setting model image through information on a wafer in which the first layer and the second layer are formed, align the setting model image and the sample image such that a center point of the setting model image is the same as a center point of the sample image and acquire an X-axis brightness value graph and a Y-axis brightness value graph, and calculate a first focus in an area having a lowest CI value in the X-axis brightness value graph and the Y-axis brightness value graph, and measure a first image which is one of the plurality of images with the first focus and to calculate a second focus in an area having a highest CI value in the X-axis brightness value graph and the Y-axis brightness value graph, and measure a second image which is the other one of the plurality of images with the second focus.

3. The overlay measurement apparatus of claim 2, wherein the controller includes:

a storage unit storing the sample image acquired by the detection unit, model information of a layer stacked in the wafer, and the plurality of images measured with the focus determined according to the CI information;

an alignment unit aligning the setting model image of any one the model information and the sample image by comparing center points of the setting model image and the sample image;

a CI acquisition unit acquiring the CI information indicating the X-axis brightness value change and the Y-axis brightness value change of the setting model image and the sample image of which center points coincide with each other;

a focus calculation unit calculating the first focus at a point having a lowest CI value among the CI information, and calculating the second focus at a point having a highest CI value among the CI information; and an overlay calculation unit comparing center points of the plurality of images and calculating a difference.

4. The overlay measurement apparatus of claim 1, wherein the setting model image is formed in any one of a quadrangle, a quadrangle having corners with a predetermined curvature, a circle, and an ellipse according to prestored thicknesses of the first layer and the second layer, or the sample image.

5. The overlay measurement apparatus of claim 1, wherein the controller includes a lens operation unit controlling an operation of the lens focus actuator to acquire respective images of the first layer and the second layer by depth according to the focus.

6. The overlay measurement apparatus of claim 1, wherein the first filling unit and the second filling unit are through silicon vias (TSVs) which are filled in a hole portion penetrating the first layer and the second layer as a conductor to electrically connect patterns formed in the first layer and the second layer.

7. An overlay measurement method comprising:

aligning a sample image measured at a measurement position of any one point among overlay measurement targets at which a first filling unit formed in a first layer and a second filling unit formed in a second layer, which is stacked above or below the first layer are positioned, and a prestored setting model image;

acquiring CI information of the aligned sample image and the setting model image;

measuring a plurality of images by controlling the lens with a focus determined according to the CI information; and comparing center points of the plurality of images and calculating an overlay with a difference value.

8. The overlay measurement method of claim 7, wherein aligning includes:

measuring and storing the sample image by a detector;

selecting the setting model image using information on a wafer in which the first layer and the second layer are formed; and aligning the setting model image and the sample image such that a center point of the setting model image is the same as a center point of the sample image.

9. The overlay measurement method of claim 7, wherein the CI information indicating the X-axis brightness value change and the Y-axis brightness value change of the aligned setting model image and sample image of which center points coincide with each other is acquired.

10. The overlay measurement method of claim 7, wherein measuring includes:

calculating a first focus at a point having a lowest CI value among the CI information, and calculating a second focus at a point having a highest CI value among the CI information; and measuring a first image with the first focus determined according to the CI information and measuring a second image with the second focus.

* * * * *